United States Patent
Su et al.

(10) Patent No.: US 8,338,961 B2
(45) Date of Patent: Dec. 25, 2012

(54) SEMICONDUCTOR CHIP WITH REINFORCING THROUGH-SILICON-VIAS

(75) Inventors: Michael Z. Su, Round Rock, TX (US);
Gamal Refai-Ahmed, Markham (CA);
Bryan Black, Spicewood, TX (US)

(73) Assignees: Advanced Micro Devices, Inc., Sunnyvale, CA (US); ATI Technologies ULC, Markham (CA)

( * ) Notice: Subject to any disclaimer, the term of this patent is extended or adjusted under 35 U.S.C. 154(b) by 0 days.

(21) Appl. No.: 13/456,968

(22) Filed: Apr. 26, 2012

(65) Prior Publication Data
US 2012/0205791 A1 Aug. 16, 2012

Related U.S. Application Data

(62) Division of application No. 12/889,615, filed on Sep. 24, 2010, now Pat. No. 8,193,039.

(51) Int. Cl.
*H01L 23/34* (2006.01)
(52) U.S. Cl. .................... 257/774; 257/775
(58) Field of Classification Search .......... 257/773–775
See application file for complete search history.

(56) References Cited

U.S. PATENT DOCUMENTS

| | | | |
|---|---|---|---|
| 4,645,546 A | 2/1987 | Matsushita | |
| 6,967,392 B2 * | 11/2005 | Tsai et al. | ........... 257/660 |
| 2008/0237844 A1 | 10/2008 | Aleksov et al. | |
| 2009/0079067 A1 | 3/2009 | Gerber | |
| 2009/0134500 A1 | 5/2009 | Kuo | |
| 2009/0189245 A1 | 7/2009 | Furusawa et al. | |
| 2010/0078772 A1 | 4/2010 | Robinson | |
| 2010/0237472 A1 | 9/2010 | Gillis et al. | |

OTHER PUBLICATIONS

Arthur Keigler et al.; *Copper Deposition for Pillars and Vias*; Semiconductor Manufacturing Magazine; vol. 7, Issue 8; Aug. 2006; pp. 1-6.

PCT/US2011/052469 International Search Report mailed Jan. 5, 2012.

* cited by examiner

*Primary Examiner* — Richard A. Booth
(74) *Attorney, Agent, or Firm* — Timothy M. Honeycutt

(57) ABSTRACT

A method of manufacturing includes connecting a first end of a first through-silicon-via to a first die seal proximate a first side of a first semiconductor chip. A second end of the first thu-silicon-via is connected to a second die seal proximate a second side of the first semiconductor chip opposite the first side.

21 Claims, 8 Drawing Sheets

SEMICONDUCTOR CHIP WITH REINFORCING THROUGH-SILICON-VIAS

This application is a divisional of prior application Ser. No. 12/889,615, filed Sep. 24, 2010 now U.S. Pat. No. 8,193,039.

BACKGROUND OF THE INVENTION

1. Field of the Invention

This invention relates generally to semiconductor processing, and more particularly to semiconductor chips incorporating through-silicon-vias and methods of fabricating the same.

2. Description of the Related Art

Some time ago semiconductor chip designers began stacking multiple semiconductor dice (aka "dies") vertically in order to obtain more functionality without an attendant increase in required package substrate or circuit board area. A variety of techniques have been used to electrically connect adjacent dice in such stacked arrangements. One technique has involved the use of wire bonds leading from contact pads on one die to corresponding contact pads on an adjacent die. Another technique that has been introduced more recently involves the use of so-called through-silicon-vias (TSV). A typical TSV is a conductive via that extends nearly or perhaps entirely through a semiconductor chip, depending on the presence or absence of any intervening conductor pads at one or the other of the principal surfaces of the chip.

A typical convention TSV provides electrical routing between opposite principal surfaces of a semiconductor chip. On one side, the conventional TSV is connected to some type of input/output structure (I/O), which is often a solder bump designed to form a solder joint with a package substrate during flip-chip solder reflow. The TSV is not connected directly to the solder bump, but to some intervening structure, such as an outermost metallization structure like a bump pad. The other or backside end of the TSV is connected to some form of backside I/O structure, typically through some intermediary conductor structure. The conventional TSV arrangement includes a single TSV metallurgically joined to a single bump pad.

Conventional TSVs are subjected to Joule heating and electromigration issues that vary in intensity depending on power levels, thermal management, die size and other factors. A one-to-one TSV to bump pad arrangement is subjected to such environmental considerations.

Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. By definition, a conventional semiconductor die has four sides and four corners. The dicing operation is a mechanical cutting operation performed with a type of circular saw. Dicing saws are made with great care and operate more precisely than a comparable masonry circular saw. Despite these refinements, the dicing saw still imposes significant stresses on the individual dice as they are cut. These stresses and impact loads during the cutting operation can cause microscopic fractures in the dice, particularly at the die corners. Once the cut dice are mounted to a package substrate or printed circuit board of one sort or another, the cracks introduced during cutting may propagate further into the center of the dice due to thermal stresses and other mechanical stresses that may be placed on the die. In addition, new cracks may form, particularly near the corners which create so-called stress risers by virtue of their geometries.

A conventional technique for addressing the propagation of cracks from the corners of a die involves the use of a crack stop. A conventional crack stop consists of a frame-like structure formed in and near the edges of the semiconductor die. When viewed from above, the crack stop looks like a picture frame. The conventional crack stop does not extend out to the edges of the conventional die. Because of this geometry, a crack propagating from the corner of a die can achieve a significant length before encountering the die crack stop. If the crack achieves a certain critical length before encountering the conventional crack stop, the crack can become virtually uncontrollable. The crack can overwhelm the conventional crack stop and invade the active portion of the semiconductor die and lay waste to the delicate circuit structures positioned therein. Even with conventional die seals, stacked semiconductor chips can be subjected to significant bending stresses due to thermal expansion mismatches.

The present invention is directed to overcoming or reducing the effects of one or more of the foregoing disadvantages.

SUMMARY OF EMBODIMENTS OF THE INVENTION

In accordance with one aspect of an embodiment of the present invention, method of manufacturing provided that includes connecting a first end of a first through-silicon-via to a first die seal proximate a first side of a first semiconductor chip. A second end of the first thu-silicon-via is connected to a second die seal proximate a second side of the first semiconductor chip opposite the first side.

In accordance with another aspect of an embodiment of the present invention, a method of manufacturing is provided that includes forming a first through-silicon-via in a first semiconductor chip. The first through-silicon-via includes a first end and a second end. A first die seal is formed in ohmic contact with the first end of the first through-silicon-via. A second die seal is formed in ohmic contact with the second end of the first through-silicon-via.

In accordance with another aspect of an embodiment of the present invention, an apparatus is provided that includes a first semiconductor chip that has a first side and a second and opposite side, and includes a first die seal proximate the first side and a second die seal proximate the second side. The first semiconductor chip also includes a first through-silicon-via that has a first end connected to the first die seal and a second end connected to the second die seal.

In accordance with another aspect of an embodiment of the present invention, an apparatus is provided that includes a first semiconductor chip that has a first side and a second and opposite side, and includes a first die seal proximate the first side and a second die seal proximate the second side. The first semiconductor chip also includes a first through-silicon-via that has a first end connected to the first die seal and a second end connected to the second die seal. The apparatus is embodied in instructions stored in a computer readable medium.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a semiconductor chip device that includes one more semiconductor chips are described herein. One example includes at least one semiconductor chip with plural TSVs connected between front side and backside die seals. The plural TSVs provide enhanced mechanical strength for the semiconductor chip and can serve as electrical pathways for ground and other currents. Additional details will now be described.

Figure 1:
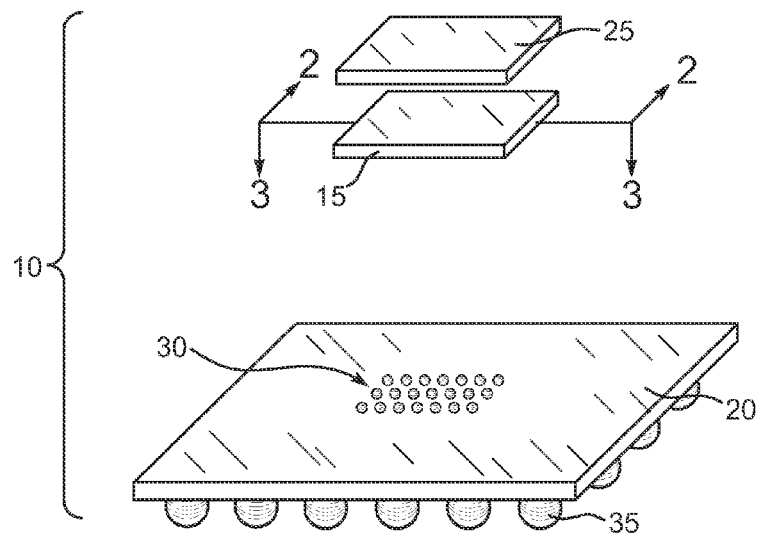
FIG. 1 is an exploded pictorial view of an exemplary embodiment of a semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown an exploded pictorial view of an exemplary embodiment of a semiconductor chip device 10 that includes a semiconductor chip 15 mounted on a circuit board 20. The semiconductor chip 15 is adapted to have one or more other semiconductor chips, one of which is shown and labeled 25, mounted thereon in a stacked arrangement. The semiconductor chip 15 may interface electrically with the circuit board 20 by way of plural interconnect structures, which may be conductive pillars, solder joints or other types of interconnects. In this illustrative embodiment, the semiconductor chip 15 may interface with the circuit board 20 by way of plural solder joints which may consist of respective solder structures (not visible) of the semiconductor chip which join metallurgically to corresponding solder structures 30 of the circuit board 20. The circuit board 20, may in turn, interface electrically with another electronic device, such as another circuit board or other device by way of plural input/output structures. In this illustrative embodiment, the input/output structures consist of an array of solder balls 35. However, the skilled artisan will appreciate that other types of interconnect structures, such as pin grid arrays, land grid arrays or other interconnect structures could be used as well.

The exemplary structures of the semiconductor chip 15 disclosed herein are not dependent on a particular electronic functionality. Thus, the semiconductor chip 15 and the semiconductor chip 25 may be any of a myriad of different types of circuit devices used in electronics, such as, for example, microprocessors, graphics processors, combined microprocessor/graphics processors, application specific integrated circuits, memory devices, active optical devices, such as lasers, passive optical devices or the like, and may be single or multi-core or even stacked laterally with additional dice. Furthermore, one or both of the semiconductor chips 15 and 25 could be configured as an interposer with or without some logic circuits. Thus the term "chip" includes an interposer. The semiconductor chips 15 and 25 may be constructed of bulk semiconductor, such as silicon or germanium, or semiconductor on insulator materials, such as silicon-on-insulator materials, other chip materials or even insulator materials.

The exemplary structures of the semiconductor chip 15 disclosed herein are not dependent on a particular electronic circuit board functionality. Thus, the circuit board 20 may be a semiconductor chip package substrate, a circuit card, or virtually any other type of printed circuit board. Although a monolithic structure could be used for the circuit board 20, a more typical configuration will utilize a buildup design. In this regard, the circuit board 20 may consist of a central core upon which one or more buildup layers are formed and below which an additional one or more buildup layers are formed. The core itself may consist of a stack of one or more layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures (not visible) in order to provide power, ground and signals transfers between the semiconductor chips 15 and 25 and another device, such as another circuit board for example. The circuit board 20 may be electrically connected to another device (not shown) by way of an input/output array such as the ball grid array depicted. The ball grid array includes the aforementioned plural solder balls 35 metallurgically bonded to respective ball pads (not shown). The ball pads (not shown) are interconnected to various conductor pads in the circuit board 20 by way of plural interconnect traces and vias and other structures that are not shown.

Figure 2:
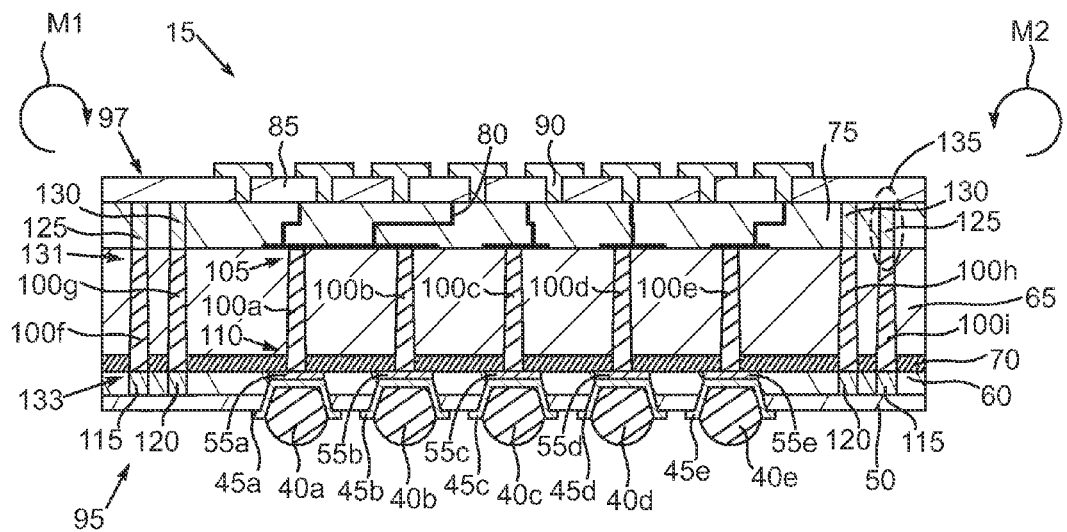
FIG. 2 is a sectional view of FIG. 1 taken at section 2-2.

Additional details of the semiconductor chip 15 will be described in conjunction with FIG. 2, which is a sectional view of FIG. 1 taken at section 2-2. As noted briefly above, the semiconductor chip 15 may include plural input/output structures that are designed to join metallurgically with the interconnect structures 30 of the circuit board 20. A few of these exemplary interconnect structures are visible and may consist of respective solder bumps 40a, 40b, 40c, 40d and 40e. The solder bumps 40a, 40b, 40c, 40d and 40e may be composed of various types of solders, such as lead-free or lead-based solders. Examples of suitable lead-free solders include tin-silver (about 97.3% Sn 2.7% Ag), tin-copper (about 99% Sn 1% Cu), tin-silver-copper (about 96.5% Sn 3% Ag 0.5% Cu) or the like. Examples of lead-based solders include tin-lead solders at or near eutectic proportions or the like. As noted above, the solder bumps 40*a*, 40*b*, 40*c*, 40*d* and 40*e* may be replaced with conductive pillars or other types of interconnect structures as desired. Here, the solder bumps 40*a*, 40*b*, 40*c*, 40*d* and 40*e* are coupled to underbump metallization (UBM) structures 45*a*, 45*b*, 45*c*, 45*d* and 45*e*, respectively. The UBM metallization structures 45*a*, 45*b*, 45*c*, 45*d* and 45*e* are formed on and in a passivation structure 50, which may be a monolithic or laminate film of insulating material. The UBM structures 45*a*, 45*b*, 45*c*, 45*d* and 45*e* are, in turn, connected to conductor structures or pads 55*a*, 55*b*, 55*c*, 55*d* and 55*e*. The conductor pads 55*a*, 55*b*, 55*c*, 55*d* and 55*e* may consist of conductor pads that actually form part of what is a metallization layer 60 that includes plural alternating layers of interlevel dielectric and metallization layers (not shown). It should be understood that FIG. 2 is somewhat schematic in nature since the conductor pads 55*a*, 55*b*, 55*c*, 55*d* and 55*e* and the metallization layer 60 are not shown to scale. In any event, the interlevel dielectric layers (not shown) used for the metallization layer 60 may consist of well-known silicon dioxide, other types of silicate glasses, low-K dielectric films or the like. The metallization structures in the layer 60 as well as the conductor pads 55*a*, 55*b*, 55*c*, 55*d* and 55*e* and the UBM structures 45*a*, 45*b*, 45*c*, 45*d* and 45*e* may be composed of various conductors, such as copper, silver, nickel, platinum, gold, aluminum, palladium, alloys or laminates of these or the like, and may be formed by well-known material placement and patterning techniques, such as plating, chemical vapor deposition (CVD) with or without plasma enhancement or the like, and lithography with chemical etching laser ablation or the like.

The semiconductor chip 15 is a multi-strata structure in that there may be a bulk semiconductor stratum or layer 65, a device stratum or layer 70 in which large numbers of transistors, capacitors and other circuit devices may be formed, and the metallization stratum or layer 60. The metallization layer 60 may be formed as a series of metallization layers sandwiched between interlevel dielectric layers that are successively built up on the device layer 70. Because the semiconductor chip 15 may be designed to have another semiconductor chip, such as the semiconductor chip 25, stacked thereon, a backside metallization scheme is provided. In this regard, a redistribution layer (RDL) 75 may be formed on the semiconductor layer 65. The RDL 75 may be monolithic or a laminate structure of one or more layers of build-up or other wise deposited insulating material interwoven with one or more RDL metallization structures 80 that may be on the same or different levels. The RDL 75 may be topped with an insulating or passivation layer 85 and plural input/output structures 90. The passivation layer 85 may be monolithic or a laminate of plural insulating films and may be composed of the same types of materials used for the passivation structure layer 50 described elsewhere herein. The input/output structures 90 may be conductive pillars, pads, solder joints or the like, and are used to establish electrical interfaces with the semiconductor chip 25 depicted in FIG. 1. The interconnect structures 90 may be composed of various conductors, such as copper, silver, nickel, platinum, gold, aluminum, palladium, alloys or laminates of these, solders or the like. The RDL structures 80 may connect to one or more of the interconnect structures 90.

To establish conducting pathways between opposite sides 95 and 97 of the semiconductor chip 15, and more particularly between the RDL structures 80 and the conductor pads 55*a*, 55*b*, 55*c*, 55*d* and 55*e*, plural TSVs 100*a*, 100*b*, 100*c*, 100*d* and 100*e* may be formed in the semiconductor layer 65 to extend through the device layer 70 and the metallization layer 60 and join the RDL structures 80 to the conductor pads 55*a*, 55*b*, 55*c*, 55*d* and 55*e*. Additional TSVs 100*f*, 100*g*, 100*h* and 100*i* may be formed in the same layers or strata 60, 65 and 70 to provide a variety of useful functions to be described in more detail below. Thus, the TSVs 100*a*, 100*b*, 100*c*, 100*d* and 100*e* may serve a traditional through-chip interconnect role. Structurally speaking, an end 105 of a given TSV, such as the TSV 100*a*, contacts the corresponding conductor pad 55*a* and the opposite end 110 of the TSV 100*a* contacts one of the RDL structures 80. It should be understood that the terms "TSV" and "semiconductor" are used generically herein, in that the semiconductor layer 65 may be composed of material (s) other than silicon, and even of insulating materials such as silicon dioxide, tetra-ethyl-ortho-silicate or others. The TSVs 100*a*, 100*b*, 100*c*, 100*d*, 100*e*, 100*f*, 100*g*, 100*h* and 100*i* may, like all the conductor structures disclosed herein, number in the scores, hundreds or more, and may be composed of a variety of materials, such as copper, tungsten, graphene, aluminum, platinum, gold, palladium, alloys of these or like. Clad structures are envisioned.

In this illustrative embodiment, the semiconductor chip 15 may be provided with front side die seals 115 and 120 and back side die seals 125 and 130. The terms "front" and "back" are somewhat arbitrary. Although the front and back side die seals 115, 120, 125 and 130 appear as column-like structures in FIG. 2, the skilled artisan will appreciate that the die seals 115, 120, 125 and 130 may actually be configured as frame-like structures that extend around the perimeter of the semiconductor chip 15. These structural aspects will be depicted in subsequent figures. The front side die seals 115 and 120 may be fabricated in the metallization layer 60 and, as described more fully below, fabricated in the same build-up fashion as the various metallization layers and interlevel dielectric layers within the metallization layer 60 itself. The back side die seals 125 and 130 may be similarly fabricated within the RDL 75, again using the same types of conductor material deposition, dielectric material deposition and patterning techniques used to fabricate the RDL 75.

Figure 14:
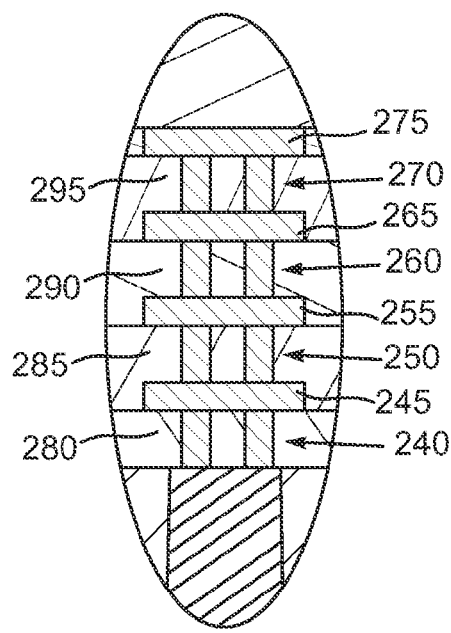
FIG. 14 depicts a portion of an exemplary die seal of FIG. 2 at greater magnification.

The TSVs 100*f*, 100*g*, 100*h* and 100*i* may be formed in the semiconductor chip 15 in contact with the front and back side die seals 115, 120, 125 and 130. A number of different types of arrangements are envisioned. In this illustrative embodiment, the TSVs 100*f* and 100*i* may be connected between the front die seal 115 and the back side die seal 125 and the TSVs 100*g* and 100*h* may be connected between the front side die seal 120 and the back side die seal 130. Structurally speaking, an end 131 of a given TSV, such as the TSV 100*f*, contacts the front side die seal 115 and the opposite end 133 of the TSV 100*f* contacts the back side die seal 125. The peripherally located TSVs 100*f*, 100*g*, 100*h* and 100*i* may serve several functions. During thermal cycling associated with both testing and actual operation, the semiconductor chip 15 may be subjected to bending moments M1 and M2. The peripheral TSVs 100*f*, 100*g*, 100*h* and 100*i* linked to the die seals 115, 120, 125 and 130 stiffen the semiconductor chip 15 and resist bending due to the moments M1 and M2. Additional benefits will be described below. The portion of FIG. 2 circumscribed by the dashed oval 135 will be shown at greater magnification in FIG. 14 and used to describe exemplary structural features for the die seals 115, 120, 125 and 130 described herein.

Figure 3:
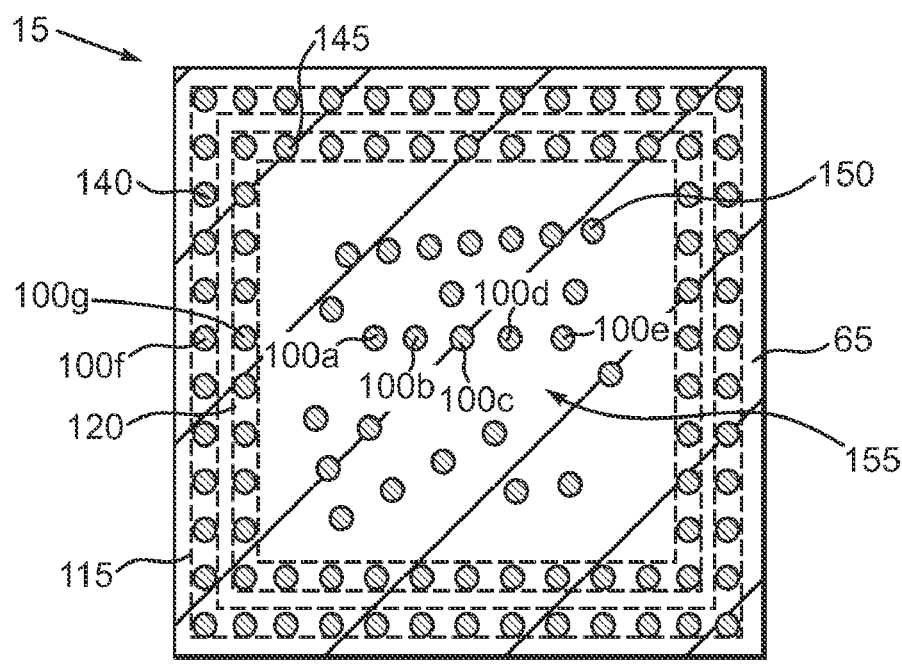
FIG. 3 is a sectional view of FIG. 1 taken at section 3-3.

Additional details of the semiconductor chip 15 may be understood by referring now to FIG. 3, which is a sectional view of the semiconductor chip depicted in FIG. 1 taken at section 3-3. Note that the TSVs 100a, 100b, 100c, 100d, 100e, 100f, 100g, 100h and 100i that were visible in FIG. 2 are visible in FIG. 3 as well, albeit in a section substantially orthogonal to the section used for FIG. 2. Because of the location of section 3-3, the semiconductor layer 65 is shown in section, however, the aforementioned front side die seals 115 and 120 are obscured by the semiconductor layer 65 and thus shown in phantom. As noted above, the front side die seals 115 and 120 may be configured substantially like (similarly to) frame-like structures as depicted in FIG. 3 that extend around the entire perimeter of the semiconductor chip 15 and thus provide a traditional crack stop functionality. Indeed, it should be understood that the back side die seals 125 and 130 which are not visible in FIG. 3 may have the same type of frame-like structure as depicted for the front side die seals 115 and 120. The number of TSVs connected to the outermost die seal 115 may be numerous indeed. These additional TSVs are collectively labeled 140 and may track the same footprint as the die seal 115. The number of TSVs that are connected to the next inner front side die seal 120 may also be quite numerous and are collectively labeled 145 and may similarly track the footprint of the die seal 120. The arrangement of the TSVs slated for through-chip interconnections, such as the TSVs 100a, 100b, 100c, 100d, 100e and additional TSVs collectively labeled 150 may be arranged in virtually limitless number of configurations depending upon the inner connect requirements for the semiconductor chip 15. The TSVs 100f, 100g, 100h and 100i and their counter part TSVs 140 and 145 may serve a variety of functions for the semiconductor chip in addition to the bending reinforcement disclosed above. One technical function served by the various TSVs 100f, 100g, 100h and 100i, 140 and 145 is a crack stop role in that the TSVs provide interspersed barriers to crack propagation towards an interior portion 155 of the semiconductor chip 15. However, and as discussed in more detail below, the TSVs 100f, 100g, 100h and 100i, 140 and 145 may provide a variety of other functions as well.

The crack stopping abilities of the peripherally placed TSVs may be enhanced further by the addition of TSV members or bars. An exemplary embodiment of a semiconductor chip 15' that incorporates not only peripheral TSVs tied to die seals but also multiple TSV bars may be understood by referring now to FIG. 4, which is a sectional view like FIG. 3 but of this alternate exemplary semiconductor chip 15'. Here, the semiconductor chip 15' may include the front side die seals 115 and 120 as generally described elsewhere herein. In addition, plural TSVs 140 may be connected to the die seal 115 as described elsewhere herein and plural TSVs 145 may be connected to the die seal 120 as described elsewhere herein. However, some or all of the TSVs 140 that are connected to the die seal 115 may be laterally connected to one of the TSVs 145 that is connected to the die seal 120 by way of TSV members or bars 160. The TSV bars 160 may be connected between adjacent TSVs 140 and 145 in a large number of different types of arrangements. For example, some of the TSV bars 160 proximate the side 165 of the semiconductor chip 15' may be connected in a zig zag pattern and others proximate the same side 165 may be disposed in a parallel arrangement. It should be understood that TSV bars 160 could be used to join all of the TSVs 140 to adjacent TSVs 145 if desired. Some or all of the TSV bars 160 could even be arcuate.

Figure 4:
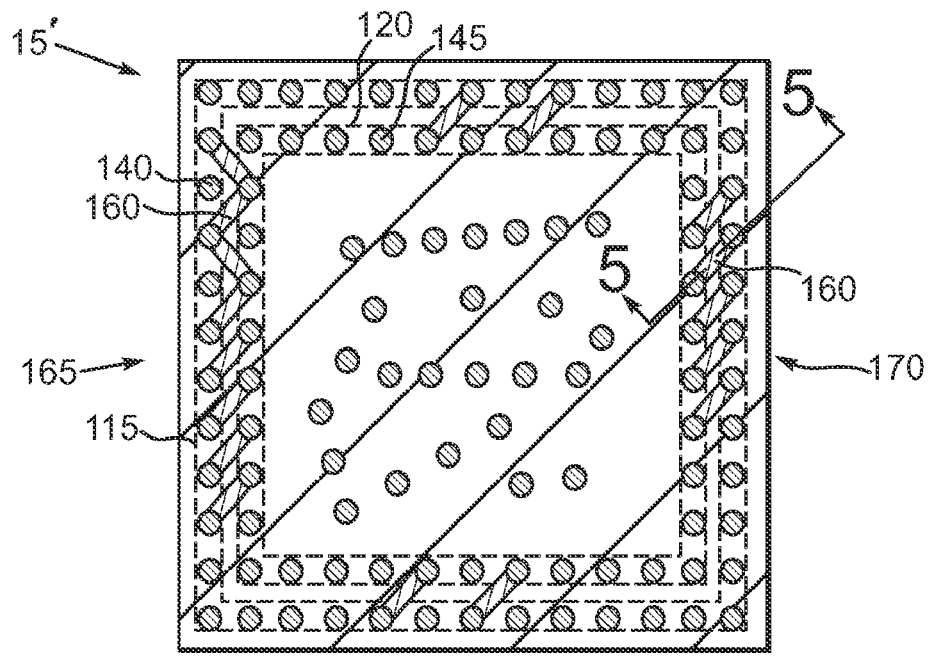
FIG. 4 is a sectional view like FIG. 3 but of an alternate exemplary embodiment in which plural TSVs are interconnected by bars.
Figure 5:
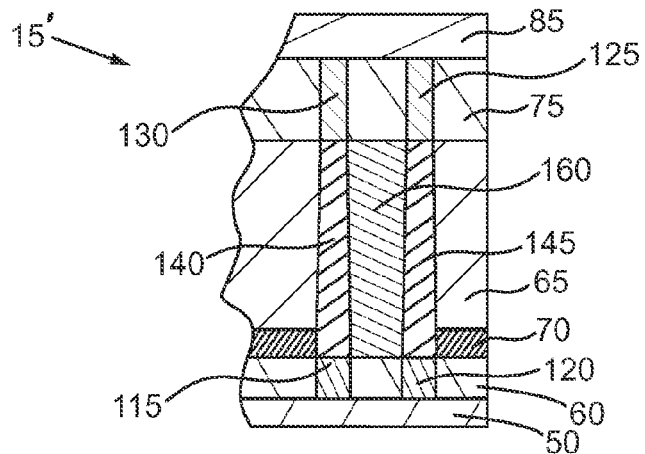
FIG. 5 is a sectional view of FIG. 4 taken at section 5-5.

An exemplary structure for the TSV bars 160 may be understood by referring now to FIG. 5, which is a sectional view of FIG. 4 taken at section 5-5. Before turning to FIG. 5, it should be noted that section 5-5 passes through one of the TSV's 160 proximate the side 170 of the semiconductor chip 15'. With that backdrop, attention is now turned to FIG. 5. Here, the die seals 115 and 120 appear in section as do two of the TSVs 140 and 145 and the intervening TSV bar 160. Because section 5-5 essentially faces into the thickness of the semiconductor chip 15', the structural features common with, for example, the semiconductor chip 15, are visible as well, such as the semiconductor layer 65, the device layer 70, the metallization layer 60, the passivation layer 50, the RDL 75 and the back side die seals 125 and 130 and the passivation layer 85. Note that the TSV bar 160, which is not a bar in the traditional sense of a cylindrical or circular member, extends between the TSVs 140 and 145 and although shown in different cross hatching, may actually be composed of the same materials as and formed at the same time as the TSVs 140 and 145. Thus, the TSV bar 160 may actually be shaped somewhat like a pillar with a fairly rectangular cross section as opposed to a more circular cross section. However, the skilled artisan will appreciate that the actual footprint of the TSV bar 160 may take on a variety of shapes.

Figure 6:
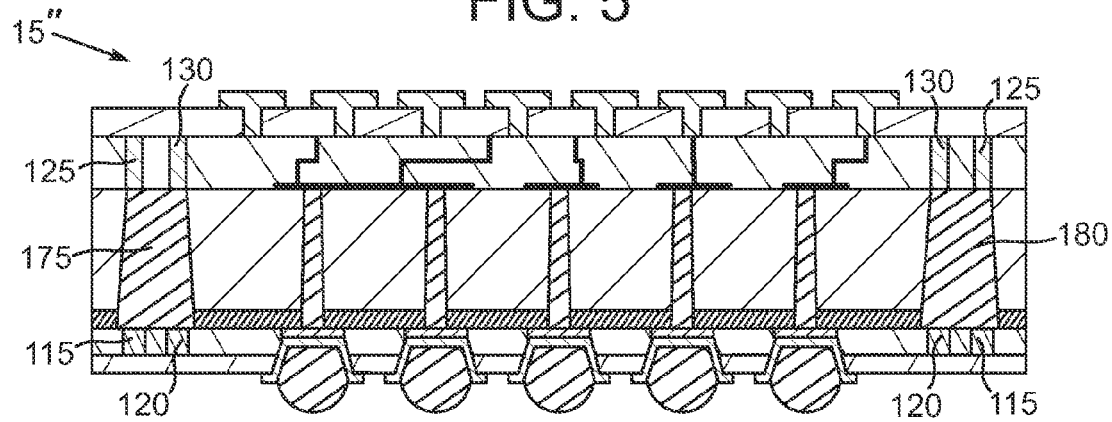
FIG. 6 is a sectional view like FIG. 2, but of an alternate exemplary embodiment of a semiconductor chip in which a given TSV may connect to multiple die seals.

In the illustrative embodiment of the semiconductor chip depicted in FIG. 2, a given peripheral TSV, for example the TSV 100a, is connected between the front side die seal 115 and the back side die seal 125, and a separate and discrete TSV 100b is connected between the front side die seal 120 and the back side die seal 130. However, due to the tremendous flexibility of prevailing lithography and material deposition processes, TSV size and configuration may be tailored so that a given TSV is connected to more than one die seal on one side of a semiconductor chip and more than one die seal on the opposite side of a semiconductor chip. In this regard, attention is now turned to FIG. 6, which is a sectional view like FIG. 2, but of an alternate exemplary embodiment of a semiconductor chip 15". The semiconductor chip 15" may be substantially identical to the semiconductor chip 15 depicted in FIG. 2 and thus identical features common to both embodiments will not be labeled separately. However, note that the front side die seals 115 and 120 and the back side die seals 125 and 130 are labeled. In this illustrative embodiment, a large footprint TSV 175 may be connected between the front side die seals 115 and 120 and the back side die seals 125 and 130 and another large footprint TSV 180 may be connected between the front side die seals 115 and 120 and the back side die seals 125 and 130. Indeed, the TSVs 175 and 180 may extend around the entire periphery of the semiconductor chip 15" much as the peripheral TSVs of the other embodiments described herein.

Figure 7:
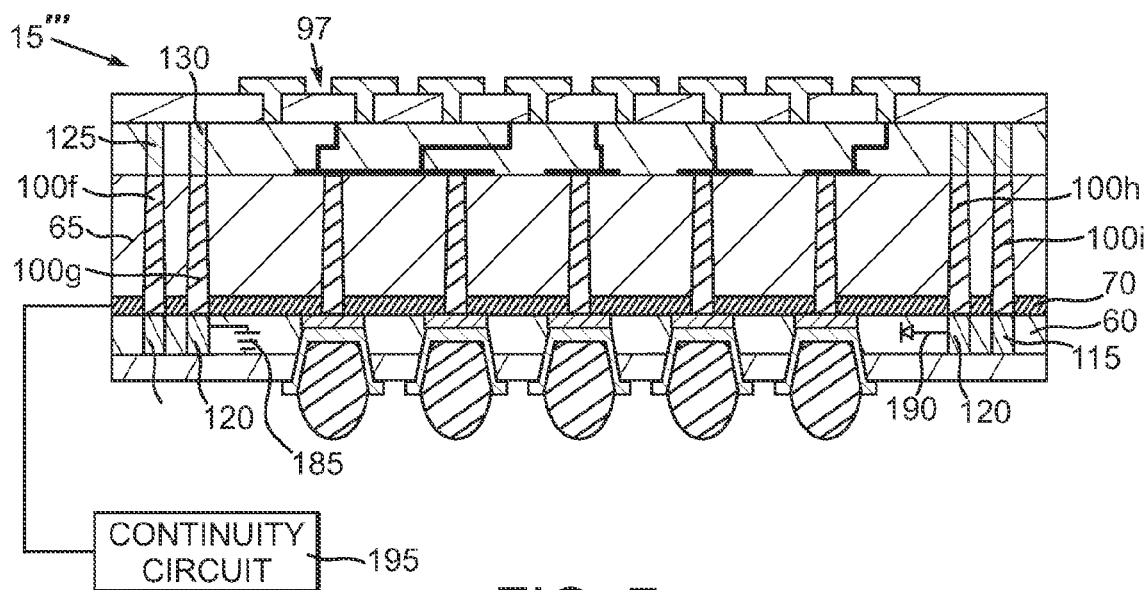
FIG. 7 is a sectional view of an alternate exemplary semiconductor chip with plural peripheral TSVs connected to die seals to provide various electrical functions.

Aside from the structural advantages using peripheral TSVs tied between die seals on opposite sides of a semiconductor chip, such peripheral TSVs may be used to provide a number of other interesting functions. In this regard, attention is now turned to FIG. 7, which is a sectional view like FIG. 2 but of an alternate exemplary embodiment of a semiconductor chip 15'''. The semiconductor chip 15''' is essentially identical to the semiconductor chip 15 depicted in FIG. 2 with a few notable exceptions to be described below. Thus, the structural features common to both the semiconductor chip 15''' and the semiconductor chip 15 are not separately labeled in FIG. 7. However, to provide context, the front side die seals 115 and 120, the back side die seals 125 and 130 are labeled as well as the peripheral TSVs 100f, 100g, 100h and 100i. This illustrative embodiment depicts several electrical functions that may be served by peripheral TSVs. In this regard, one or both of the front side die seals 115 and 120, and in this example the die seal 120, may be connected to chip ground 185. Because the TSV 100g and others like it (not visible) around the perimeter of the semiconductor chip 15''' is connected also to the die seal 130, electrostatic discharges or other unwanted currents may be channeled from the side 97 of the semiconductor chip 15''' down to chip ground 185. An additional optional feature involves the electrical connection of one or more of the die seals 115 and 120, and in this example the die seal 120 to an electrostatic discharge diode 190. Again, since the TSV 100h is tied to both the die seal 120 and the die seal 130, spurious currents due to ESD or other sources may be safely channeled to the ESD diode 190. Both the chip ground 185 and the ESD diode 190 may be fabricated as separate structures in the metallization layer 60 or even the device layer 70 if desired. The ESD diode 190 may be constructed as a well-known pn or np junction diode of sufficient size to provide ESD protection and may be composed of a large number of such diodes to handle whatever currents are anticipated.

Since the peripheral TSVs, such as the peripheral TSV 100f, can serve as an electrical pathway, an additional electrical function may be served that can aid in the detection of cracks. For example, a continuity circuit 195 may be incorporated into the device layer 70 and from a logic standpoint be simply configured as a well-known type of continuity tester. The continuity circuit 195 may be tied electrically to the TSV 100f and thus electrically to both the die seal 115 and the die seal 125. In the event that a crack propagating in the semiconductor layer 65 proximate the TSV 100f is severe enough to fracture the TSV 100f and/or the portions of the die seals 115 and 125 proximate the TSV 100f, such a fracture may result in an open circuit which will be detected by the continuity circuit 195. Thus, whenever the continuity circuit 195 detects an open condition, that finding may be reflective of a troubling crack.

Figure 8:
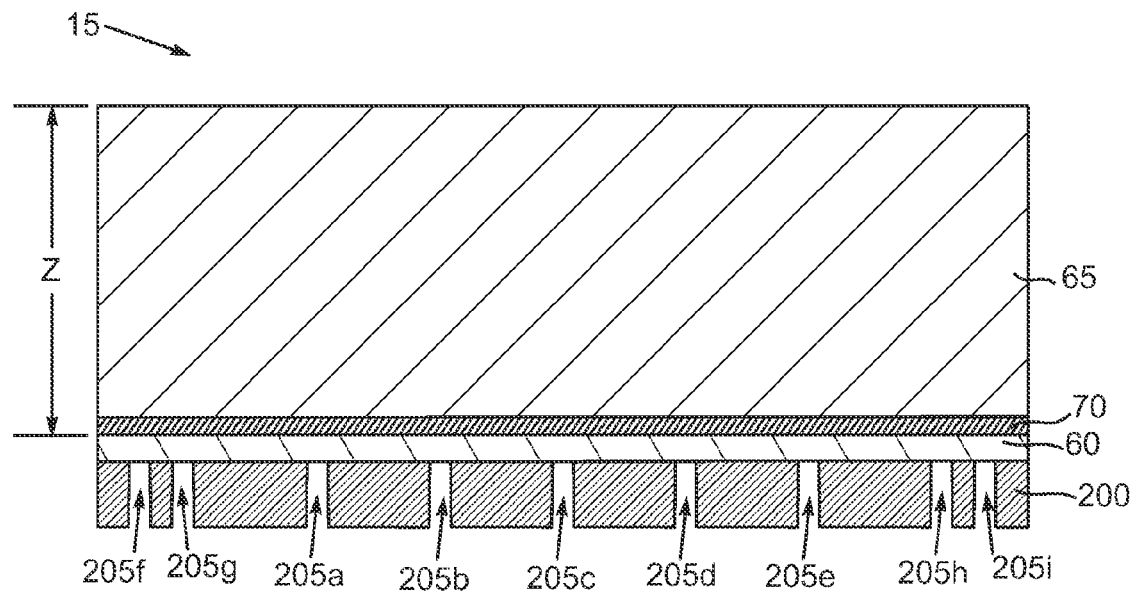
FIG. 8 is a sectional view of an exemplary semiconductor chip undergoing exemplary lithographic processing.

An exemplary process for forming the plural TSVs may be understood by referring now to FIGS. 8, 9, 10, 11, 12 and 13 and initially to FIG. 8, which is a sectional view of the semiconductor chip 15 at a preliminary stage of processing. At this stage, the device layer 70 has been fabricated using a multitude of well-known processing steps. The metallization layer 75 may also be fully or partially completed or not prior to TSV formation. At this point, the semiconductor chip 15 has a thickness Z, taken up primarily by the semiconductor layer 65, that is larger than the final thickness following the formation of the TSVs and the RDL 75 as shown in FIG. 2. At this point, a suitable lithography mask 200, may be applied to the metallization layer 60 and patterned lithographically to establish openings 200a, 200b, 200c, 200d, 200e, 200f, 200g, 200h and 200i which, correspond to the desired locations for the subsequently formed TSVs 100a, 100b, 100c, 100d, 100e, 100f, 100g, 100h and 100i. The mask 200 may be composed of well-known photoresist materials and could be either positive or negative tone. Optionally, a non-contact or even a hard mask could be used.

Figure 9:
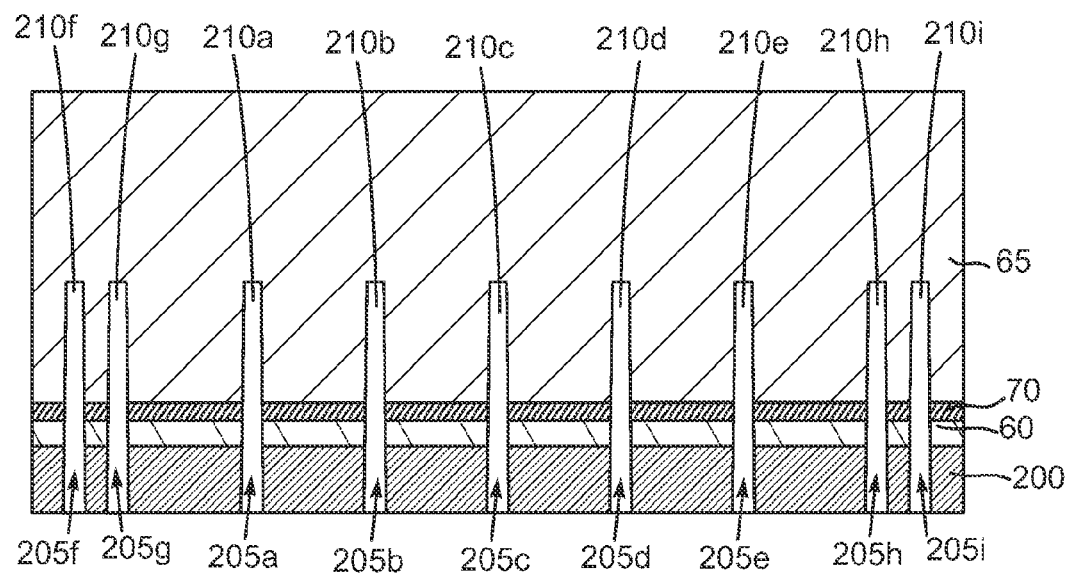
FIG. 9 is a sectional view like FIG. 8, but depicting exemplary formation of TSV trenches.

Referring now to FIG. 9, following the patterning of the mask 200, a material removal process may be used to form deep trenches in the semiconductor layer 65. The trenches are labeled 210a, 210b, 210c, 210d, 210e, 210f, 210g, 210h and 210i. The trenches 210a, 210b, 210c, 210d, 210e, 210f, 210g, 210h and 210i may be formed by chemical etching with or without plasma enhancement or other material removal techniques. It might be possible to use laser ablation although care should be exercised to avoid excessive thermal heating. Of course, the openings 200a, 200b, 200c, 200d, 200e, 200f, 200g, 200h and 200i in the mask 200 are patterned to have the desired footprint for the ultimately formed trenches 210a, 210b, 210c, 210d, 210e, 210f, 210g, 210h and 210i.

Figure 10:
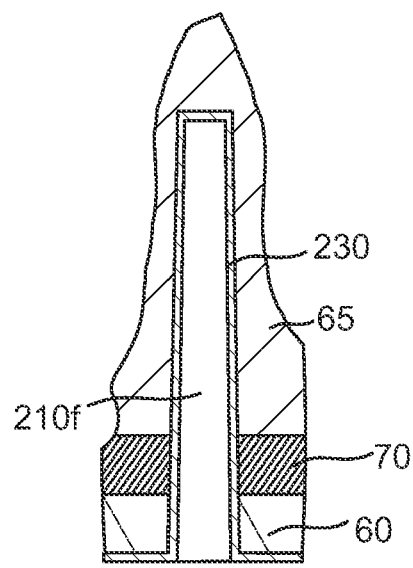
FIG. 10 shows a sectional view depicting a portion of FIG. 9 at greater magnification.

Depending upon the composition of the later-formed TSVs, it may be necessary to apply a liner film in the trenches 210a, 210b, 210c, 210d, 210e, 210f, 210g, 210h and 210i in order to facilitate both adhesion to the semiconductor layer 65 as well as prevent migration of atoms, molecules or larger portions of the TSVs into the semiconductor layer 65 and the device layer 70. FIG. 10 shows a sectional view of the trench 210f shown at greater magnification. A liner layer 230 may be formed in the trench 210f and coat only the sidewalls of the trench 210f but also the sidewalls of the device layer 70 and the metallization layer 60. The liner layer 230 may be composed of a variety of materials, such as silicon dioxide. Well-known CVD techniques with or without plasma enhancement may be used to deposit the liner layer 230. The same may be done with regard to the other trenches 210a, 210b, 210c, 210d, 210e, 210g, 210h and 210i shown in FIG. 9. The mask 200 shown in FIG. 9 may be removed before or after formation of the liner layer 230 by ashing, solvent stripping or the like, or lift off if a non-contact mask is used.

Figure 11:
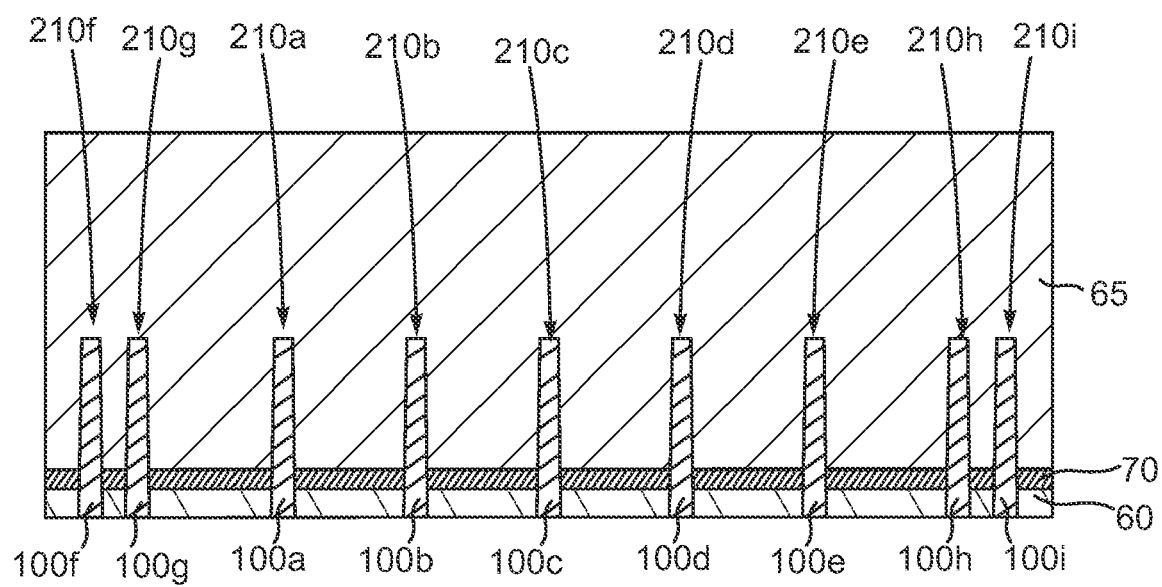
FIG. 11 is a sectional view like FIG. 9, but depicting exemplary TSV formation.

Following the removal of the etch mask 200 shown in FIGS. 8 and 9, the TSVs 100a, 100b, 100c, 100d, 100e, 100f, 100g, 100h and 100i may be formed in the respective trenches 210a, 210b, 210c, 210d, 210e, 200f 210g, 210h and 210i as shown in FIG. 11. As noted elsewhere herein, the TSVs 100a, 100b, 100c, 100d, 100e, 100f, 100g, 100h and 100i may be formed in the respective trenches 200, 205, 210, 215, 220 and 225 as full-formed columns or as annular TSVs as desired. The plating process may be a single step biased plating process or may be an unbiased seed layer plating process followed by a biased plating process as desired.

Figure 12:
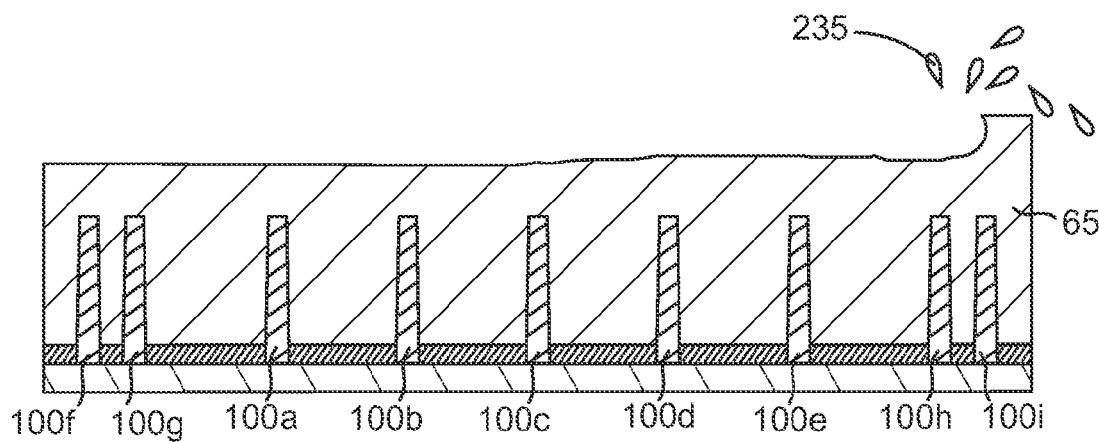
FIG. 12 is a sectional view like FIG. 11 depicting exemplary thinning of the semiconductor chip.
Figure 13:
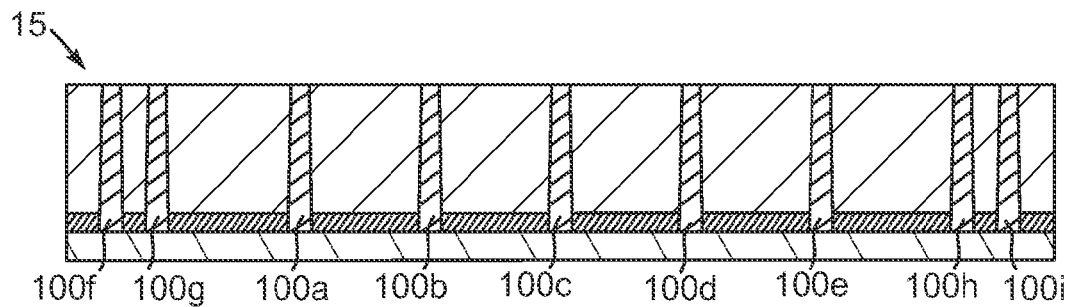
FIG. 13 is a sectional view like FIG. 12 depicting the semiconductor chip following thinning.

To enable the TSVs 100a, 100b, 100c, 100d, 100e, 100f, 100g, 100h and 100i to establish ohmic contact with structures in the later-formed RDL 75 shown in FIG. 2, the semiconductor layer 65 may be thinned as shown in FIG. 12. Here, portions 235 of the semiconductor layer 65 may be removed advantageously by chemical mechanical planarization (CMP), although other material removal techniques could be used in lieu of or in conjunction with CMP. The thinned semiconductor chip 15 with the TSVs 100a, 100b, 100c, 100d, 100e, 100f, 100g, 100h and 100i exposed is shown in FIG. 13. With the TSVs 100a, 100b, 100c, 100d, 100e, 100f, 100g, 100h and 100i exposed, the RDL 75 depicted in FIG. 2 may be fabricated using well-known insulating material deposition and conductor material deposition and patterning techniques that may number over multiple layers depending upon the complexity of the RDL 75. Similarly, the fabrication of the passivation structure 85 and the interconnect structures 90 may follow the formation of the RDL 75.

The material removal process depicted in FIG. 12, particularly if CMP is used, may result in certain surface defects such as pits, gouges and scratches. Such surface defects can provide abrupt surfaces that create highly localized stress risers that may spawn crack formation. Accordingly, it may be desirable to perform a post thinning etch process in order to smooth out such surface defects. For example, a wet etch may be used to remove a fraction of a micron or so of the layer 65. Well-known wet etchants suitable for etching silicon or whatever material happens to constitute the layer 65 may be used, such as a buffered HF spin applied etch.

Referring again to FIG. 1, the semiconductor chip 25 may be stacked on the semiconductor chip 15 and electrically connected thereto by solder reflow, compression bonding or other techniques depending on the type of chip-to-chip interface used. The skilled artisan will appreciate that semiconductor chip 25 could be stacked on the semiconductor chip 15 at the wafer level or die level as desired. The semiconductor chips 15 and 25, may be mounted to the circuit board 20, singly or en masse.

As noted above, the dashed oval 135 in FIG. 2 circumscribes a small portion of the back side die seal 125. The portion within the oval 135 is shown at greater magnification in FIG. 14. Due to the location of the dashed oval 135 in FIG. 2, a small portion of the TSV 100*i*, the semiconductor layer 65, the passivation layer 85 and the aforementioned small portion of the die seal 125 is visible. As noted elsewhere herein, any of the die seals disclosed herein may be constructed as a plurality of stacked conductor structures interconnected by conductive vias. In this example, and proceeding from the TSV 100*i* up, the portion of the die seal 125 visible may consist of a pair of conductive vias 240, a conductor trace 245, another pair of vias 250, another conductor trace 255, another pair of vias 260, another conductor trace 265, a final pair of vias 270 and a final conductor trace 275. The vias 240, 250, 260 and 270 and conductors 245, 255, 265 and 275 may be formed in a stacked up arrangement interspersed with interlevel dielectric films 280, 285, 290 and 295. The number and arrangement of vias 240, 250, 260 and 270 and the conductor structures 245, 255, 265 and 275 may be subject to great variation.

Figure 15:
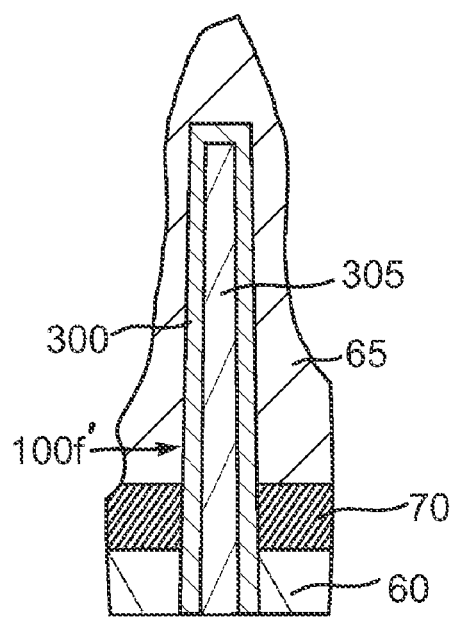
FIG. 15 depicts a sectional view of an alternate exemplary TSV with a clad arrangement.

Attention is now turned to FIG. 15, which is a sectional view of an alternate exemplary embodiment of the TSV 100*f′* penetrating the semiconductor layer 65, device layer 70 and metallization layer 60. Here, the TSV 100*f* may take on a clad arrangement and thus consist of a jacket 300 and a polymer core 305. The jacket 300 may be composed of copper, tungsten, graphene, aluminum, platinum, gold, palladium, alloys of these or like. The polymer core 305 may be composed of a variety of polymers which may be conducting or non-conducting as desired. Examples include Namics 119, well-known epoxies or the like. These so-called annular TSVs can be formed by carefully tailored plating by way of tightly controlled electric field generation during a plating process. Any or all of the TSVs of a given semiconductor chip could be so arranged.

Figure 16:
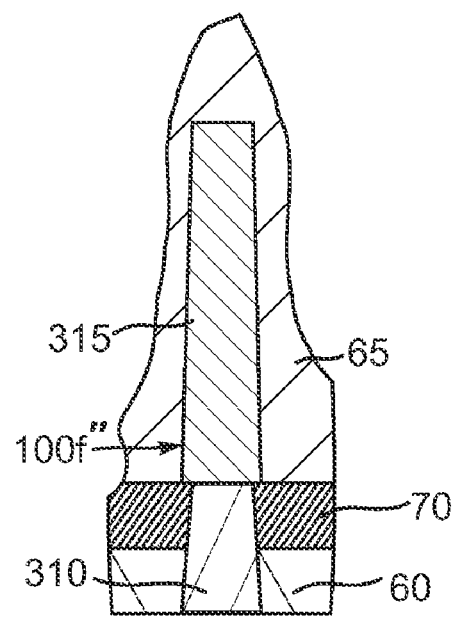
FIG. 16 depicts a sectional view of an another exemplary TSV with a multi-tiered arrangement.

In the foregoing illustrative embodiments, the various TSVs are fabricated as a continuous structure from top to bottom. However, the skilled artisan will appreciate that multi-tiered structures could be used for TSVs. In this regard, attention is now turned to FIG. 16, which is a sectional view like FIG. 15, but of an alternate exemplary embodiment of the TSV penetrating the semiconductor layer 65, device layer 70 and metallization layer 60. Here, the TSV 100*f″* may include stacked segments 310 and 315. The number and arrangement of segments 310 and 315 may be varied. Any or all of the TSVs of a given semiconductor chip could be so arranged.

Any of the disclosed embodiments may combine the beneficial aspects of connecting a TSV to one or more die seals with additional useful features that may assist in the diversion of unwanted impurities from one portion of a semiconductor chip to another. In this regard, attention is now turned to FIG. 17, which is a sectional view of an alternate exemplary embodiment of a semiconductor chip 15′″′. The semiconductor chip 15′″′ may be substantially identical to the semiconductor chip 15 depicted in FIGS. 1 and 2 and described elsewhere herein with a notable exception. Accordingly, the passivation layer 50, the metallization layer 60, the semiconductor layer 65, the device layer 70, a few of the TSVs 100*f*, 100*g*, 100*h* and 100*i*, and the die seals 115, 120, 125 and 130 are labeled, while much of the element numbering from FIG. 2 is not repeated in FIG. 17 for simplicity of illustration. This illustrative embodiment typifies what may be done with a semiconductor chip and TSV-to-die seal connections. Here, a gettering layer 330 may be formed in the semiconductor chip 15′″′ in such a way that one or more of the TSVs 100*a*, 100*b*, 100*f* and 100*g* traverse it. It is particularly desirable for the peripheral TSVs die seals 100*f*, 100*g*, 100*h* and 100*i* to traverse the gettering layer 330. A technical goal is to facilitate the selective transport of impurities, represented schematically by the asterisks 335, that may invade the semiconductor chip 15′″′ proximate one or other of the die seals 115, 120, 125 or 130. Such impurities will be urged away from the die seals 115, 120, 125 or 130 down or up along the TSVs 100*f*, 100*g*, 100*h* and 100*i* to the gettering layer 330 and thus away from the device layer 70 and the metallization layer 60, which can both be relatively sensitive to the influences of impurity contamination. Typical types of impurities 335 include sodium, potassium, iron and similar types of ions.

Figure 17:
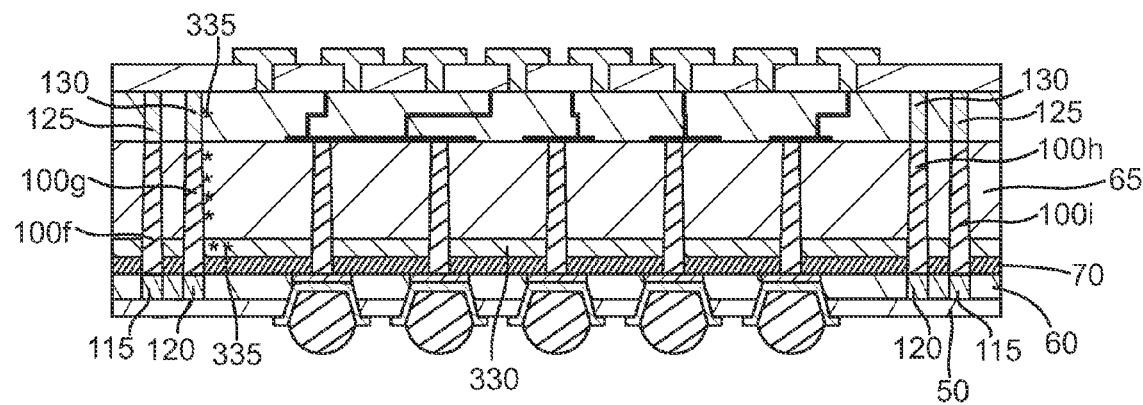
FIG. 17 is a sectional view like FIG. 2 but of an alternate exemplary embodiment of a semiconductor chip with through-silicon vias and a gettering layer.
Figure 18:
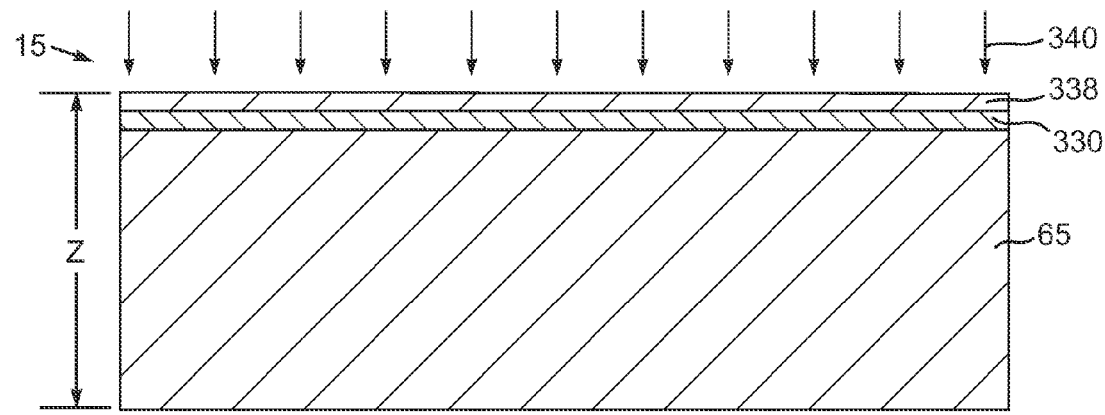
FIG. 18 is a sectional view of the alternate exemplary semiconductor chip undergoing exemplary formation of the gettering layer.

A variety of techniques may be used to establish the gettering layer 330 in the semiconductor chip 15′″′. In one exemplary embodiment, an ion implant may be performed on the semiconductor chip 15 as depicted in FIG. 18. Here, the semiconductor chip 15′″′ is depicted flipped over from the orientation depicted in FIG. 17 and prior to formation of the various TSVs 100*f*, 100*g*, 100*h* and 100*i*, the metallization layer 60 and the device layer 70, and before the semiconductor layer 65 is thinned from the initial thickness Z. The location of the later-formed device layer 70 shown in FIG. 17 is labeled 338. The implanted species 340 may be oxygen or other well-known gettering species. The goal of the implant is to establish interstitial oxygen or other species along with an attendant disruption of the lattice structure of the semiconductor layer 65 of the semiconductor chip 15. A variety of parameters may be used for the ion implant. In this illustrative embodiment, the implant may be carried out with a dosage of about 1E16 to 1E17 cm$^{-2}$ and an energy of about 100 to 120 KeV. The energy of the implants should be tailored to position the peak concentration of the gettering layer 330 at a sufficient depth to enable the device layer 70 to be easily formed without difficulty. It may also be possible to form the gettering layer 330 by way of other than implants such as by a selective epitaxial growth of material accompanied by an atmosphere of an appropriate impurity such as oxygen or even perhaps boron or phosphorous if a species that alters the conductivity of the semiconductor chip locally can be tolerated.

Figure 19:
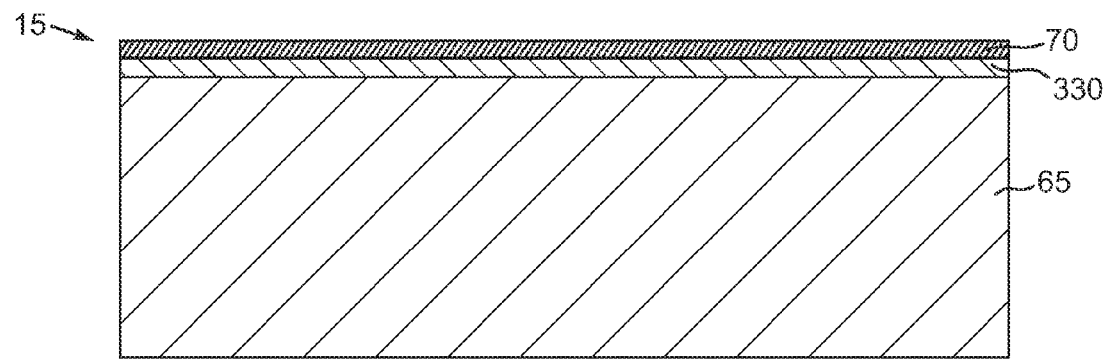
FIG. 19 is a sectional view like FIG. 18 but depicting the fabrication of a device layer proximate the gettering layer.

With the gettering layer 330 in place, the device layer 70 may be fabricated as depicted in FIG. 19. Again, the skilled artisan will appreciate the fabrication of the device layer 70 may involve scores, hundreds or more of different processing steps necessary to fabricate what may be huge numbers of logic circuits and components. Following the formation of the device layer 70, the semiconductor chip 15′″′ may be further processed to establish the TSVs 100*f*, 100*g*, 100*h* and 100*i* in the semiconductor layer 65 and the other components depicted in FIG. 17 using the techniques described elsewhere herein for the other illustrative embodiments.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a first semiconductor chip having a first side and a second and opposite side and including a first die seal proximate the first side and a second die seal proximate the second side; and
   a first through-silicon-via having a first end connected to the first die seal and a second end connected to the second die seal.

2. The apparatus of claim 1, wherein the first die seal is electrically connected to ground.

3. The apparatus of claim 1, wherein the first semiconductor chip comprises an electrostatic discharge diode electrically connected to the first die seal.

4. The apparatus of claim 1, comprising a third die seal proximate the first side and connected to the first end of the first through-silicon-via and a fourth die seal proximate the second side and connected to the second end of the first through-silicon-via.

5. The apparatus of claim 1, comprising a third die seal proximate the first side, a fourth die seal proximate the second side, and a second through-silicon-via having a first end connected to the third die seal and a second end connected to the fourth die seal.

6. The apparatus of claim 5, comprising a conductor member connected to adjacent surfaces of the first and second through-silicon-vias.

7. The apparatus of claim 1, comprising a second semiconductor chip stacked on the first semiconductor chip.

8. The apparatus of claim 7, wherein the first semiconductor chip comprises an interposer.

9. The apparatus of claim 1, wherein the first semiconductor chip comprises a continuity circuit electrically connected to the first through-silicon-via.

10. The apparatus of claim 1, comprising a gettering layer in the first semiconductor chip in contact with the first through-silicon-via.

11. An apparatus, comprising:
    a circuit board;
    a first semiconductor chip coupled to the circuit board and having a first side and a second and opposite side and including a first die seal proximate the first side and a second die seal proximate the second side; and
    a first through-silicon-via having a first end connected to the first die seal and a second end connected to the second die seal.

12. The apparatus of claim 11, wherein the circuit board comprises a semiconductor chip package substrate.

13. The apparatus of claim 11, wherein the first semiconductor chip comprises an electrostatic discharge diode electrically connected to the first die seal.

14. The apparatus of claim 11, comprising a third die seal proximate the first side and connected to the first end of the first through-silicon-via and a fourth die seal proximate the second side and connected to the second end of the first through-silicon-via.

15. The apparatus of claim 11, comprising a third die seal proximate the first side, a fourth die seal proximate the second side, and a second through-silicon-via having a first end connected to the third die seal and a second end connected to the fourth die seal.

16. The apparatus of claim 15, comprising a conductor member connected to adjacent surfaces of the first and second through-silicon-vias.

17. The apparatus of claim 11, comprising a second semiconductor chip stacked on the first semiconductor chip.

18. The apparatus of claim 17, wherein the first semiconductor chip comprises an interposer.

19. The apparatus of claim 11, wherein the first semiconductor chip comprises a continuity circuit electrically connected to the first through-silicon-via.

20. The apparatus of claim 11, comprising a gettering layer in the first semiconductor chip in contact with the first through-silicon-via.

21. An apparatus, comprising:
    a first semiconductor chip having a first side and a second and opposite side and including a first die seal proximate the first side and a second die seal proximate the second side;
    a first through-silicon-via having a first end connected to the first die seal and a second end connected to the second die seal; and
    wherein the apparatus is embodied in instructions stored in a computer readable medium.

* * * * *